(12) United States Patent
Huijsing et al.

(10) Patent No.: US 6,734,723 B2
(45) Date of Patent: May 11, 2004

(54) CHOPPER CHOPPER-STABILIZED OPERATIONAL AMPLIFIERS AND METHODS

(75) Inventors: Johan Hendrik Huijsing, Schipluiden (NL); Maarten Jeroen Fonderie, Santa Clara, CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 0 days.

(21) Appl. No.: 10/117,246

(22) Filed: Apr. 5, 2002

(65) Prior Publication Data

US 2003/0189461 A1 Oct. 9, 2003

(51) Int. Cl.[7] .................................................. H03F 1/02
(52) U.S. Cl. ......................................................... 330/9
(58) Field of Search ............................. 330/9; 327/124, 327/307; 341/118

(56) References Cited

U.S. PATENT DOCUMENTS 6,262,626 B1 * 7/2001 Bakker et al. ................. 330/9
6,456,159 B1 * 9/2002 Brewer .......................... 330/9
6,566,942 B2 * 5/2003 Shigenobu ..................... 330/9

\* cited by examiner

*Primary Examiner*—Steven J. Mottola
(74) *Attorney, Agent, or Firm*—Blakely, Sokoloff, Taylor & Zafman LLP

(57) ABSTRACT

An amplifier topology that combines the use of chopping and chopper stabilization, and may include auto-zeroing to achieve this very low offset. The use of choppers guarantees a very low offset, and moreover, eliminates the so-called 1/f noise. Chopper stabilization is used to avoid the so-called chopper noise associated with chopper amplifiers. The auto-zeroing technique may be used to improve the performance of the chopper-stabilization circuitry. Various exemplary embodiments are disclosed.

42 Claims, 13 Drawing Sheets

FIG. 7
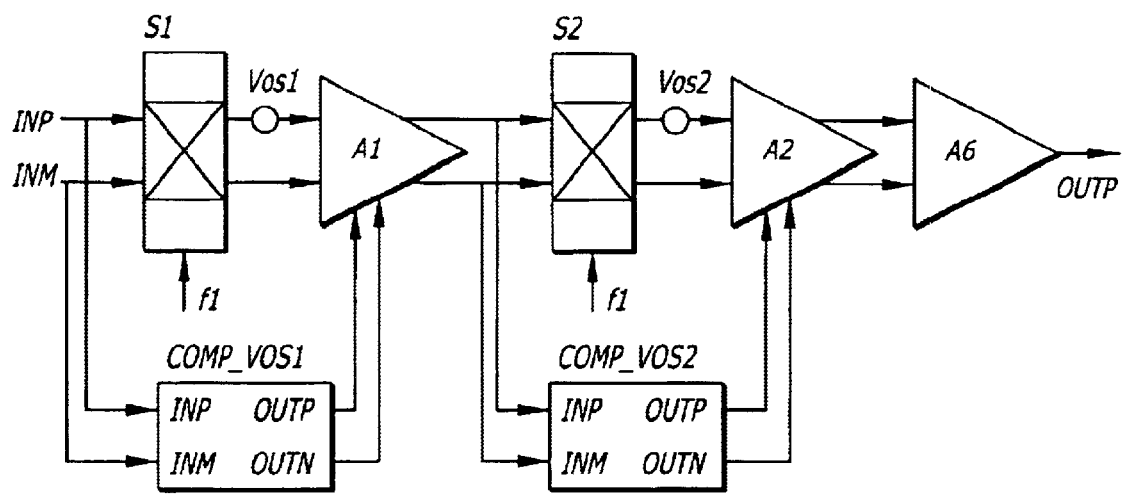
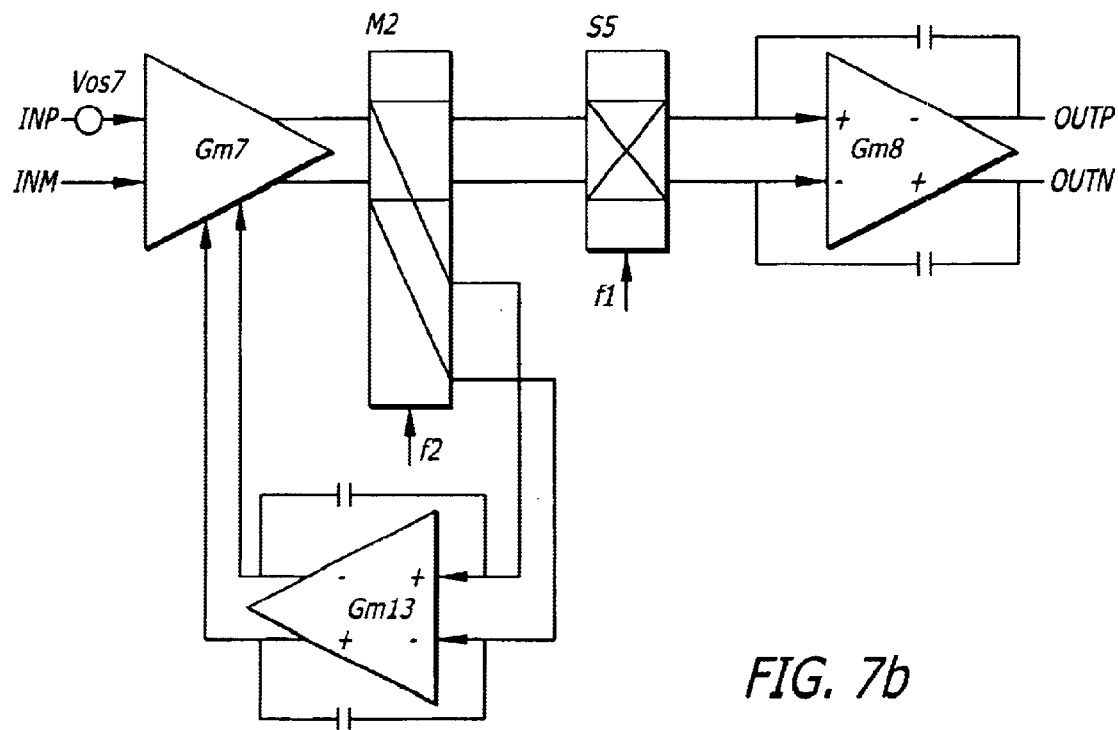
FIG. 7b

CHOPPER CHOPPER-STABILIZED OPERATIONAL AMPLIFIERS AND METHODS

BACKGROUND OF THE INVENTION

1. Field of the Invention

The present invention relates to the field of chopper-stabilized operational amplifiers.

2. Prior Art

Operational amplifiers (op amps) are high gain amplifiers typically having a differential input and a single ended or differential output. They are commonly coupled with negative feedback, so that the gain and frequency response of the overall circuit is determined primarily by the combination of the input circuitry and the feedback circuitry, not by the gain and frequency response of the op amp itself, at least at frequencies wherein the gain of the op amp remains high. A perfect op amp will have a zero output when the differential input is zero, and an infinite gain and zero phase shift, at least throughout the frequency range of interest. However a real op amp will have a high but finite gain, which typically will decrease at high frequencies, and some phase shift at higher frequencies characteristic of the particular op amp design. Also, a real op amp will not have a zero output for a zero differential input, but rather will have a zero output at some finite differential input. In a closed loop system, the system will settle at a differential input that will provide the required op amp output. Since the gain of the op amp is high, this differential input is substantially equal to the differential input that will cause a zero output. This is commonly referred to as the input offset, and will cause an error in the output of the system equal to the input offset times the gain between that input and system output.

Now referring to FIG. 1, a block diagram of a prior art amplifier consisting of a differential output stage A2 driven by a differential input stage A1 may be seen. Imperfect component matching inside input stage A1 results in an input offset voltage Vos1 which can be modeled by a small voltage source Vos1 in series with the input terminals of input stage A1, which stage may then be considered offset free (differential output stage A2 may also have some input offset, but its effect is divided down by the gain of the differential input stage, so may have little effect on the final amplifier output). Voltage feedback around the amplifier in a feedback system will force the voltages on the input terminals IN+ and IN− of input stage A1 to be substantially equal, resulting in a voltage difference Vos1 between the operational amplifier's input terminals INP and INM.

FIG. 2a is a block diagram illustrating a well known method of reducing the offset, namely by adding so-called choppers S1 and S2 before and after input stage A1. The choppers consist of switches with two positions. In the first position, the inputs I1 and I2 are connected to the outputs O1 and O2, respectively. In the second position, the inputs I1 and I2 are connected to the outputs O2 and O1, respectively. The choppers S1 and S2 are synchronized to repeatedly switch between the first and the second positions at the rate of a clock signal f1. This action alternately inverts the effect of the offset voltage Vos1, and twice inverts the effect of the differential input INP−INM. The alternate double inversion of the differential input has no effect on the output OUTP−OUTM. However the alternate inversion of the effect of the offset voltage converts the offset voltage Vos1 into a square wave signal between the input terminals INP and INM with a peak-to-peak voltage amplitude equal to 2*Vos1 and an average value of zero. An amplifier that achieves high precision (low apparent input offset) in this manner is referred to herein and in the art as a chopper amplifier.

An additional advantage of the chopping technique is that it eliminates the so-called 1/f or flicker noise. This type of noise is present in all active devices and can easily be the dominating error source in amplifiers consisting of MOS transistors. Because 1/f noise is mostly present at low frequencies, it can be modeled as a slowly changing offset voltage. For the purpose of this invention disclosure, no distinction will be made between 1/f noise and offset voltages. The chopping action modulates the offset up to the chopping frequency, and even though the average value of the offset is now zero, filtering is required to remove frequency components at and above the chopping frequency from the signal bandwidth. This effectively reduces the usable signal bandwidth of the chopper amplifier.

Another prior art amplifier is shown in the block diagram of FIG. 2b. Here the amplifier signal path is through amplifier stages A1 and A2. Choppers S3 and S4 and amplifier stage Gm3 form a chopper amplifier having an output proportional to the input offset of the amplifier formed by amplifier stages A1 and A2, plus an AC component at the chopping frequency. Amplifier Gm4 together with feedback capacitors form an integrator, filtering out the AC component at the chopping frequency, and integrating the output of the chopper amplifier to apply an offset trim signal to amplifier stage A1 to minimize the input offset of the amplifier formed by amplifier stages A1 and A2. Amplifiers using a chopper amplifier out of the main amplifier signal path to provide an input offset trim signal to an amplifier stage in the main signal path are referred to herein and in the art as chopper stabilized amplifiers, with the trim accomplished by the use of a chopper amplifier being referred to herein and in the art as chopper stabilization.

BRIEF SUMMARY OF THE INVENTION

An amplifier in accordance with the present invention achieves very high precision in combination with good high-frequency behavior. High precision, in this context, refers to an amplifier having a very low input offset voltage, where the input offset voltage is defined as the voltage difference between the input terminals necessary to drive the single ended output terminal to zero, or to drive the differential output to zero.

An amplifier topology is described that combines the use of chopping and chopper stabilization, and may include auto-zeroing to achieve this very low offset. The use of choppers guarantees a very low offset, and moreover, eliminates the so-called 1/f noise. Chopper stabilization is used to avoid the so-called chopper noise associated with chopper amplifiers. The auto-zeroing technique may be used to improve the performance of the chopper-stabilization circuitry. Various exemplary embodiments are disclosed.

BRIEF DESCRIPTION OF THE DRAWINGS

FIG. 7 is a diagram illustrating further extensions of the circuits illustrated in the previous Figures.

FIGS. 7a and 7b are diagrams providing details of blocks COMP_VOS1 and COMP_VOS2 of FIG. 7.

DETAILED DESCRIPTION OF THE PREFERRED EMBODIMENTS

In the foregoing discussion of the prior art, it was pointed out that in a conventional chopper op amp, the chopping action modulates the offset up to the chopping frequency, and even though the average value of the offset is zero, filtering is required to remove frequency components at and above the chopping frequency from the signal bandwidth. This effectively reduces the usable signal bandwidth of the chopper amplifier. In the present invention, such filtering need not be used, but instead the frequency components in the op amp output resulting from the chopping in the main signal path through the op amp are fed back through the feedback circuit to the input of the op amp, and in a path generally separate from the main op amp signal path, are effectively demodulated, amplified and integrated, and the integral used to offset trim a stage in the main signal path through the op amp. Assuming proper polarity of the trim adjustment, the trim adjustment will stop when the integral stabilizes. Consequently, the feedback from the trim generation path need not be a true integral in the pure mathematical sense, but rather can simply be some form of accumulation of the effects of the offset, which accumulation will stop (or hunt around a fixed value) when the offset is zero. Since the integration provides a strong filtering effect, separate filtering in the trim generation path is also not required.

Op amps are commonly used with resistive feedback to provide an accurate fixed gain amplifier. In these and many other applications, the feedback circuit has an adequate frequency response to feed back the frequency components resulting from the chopping in the main signal path through the op amp. In other applications of op amps, the feedback from op amp output to op amp input may be through a complex impedance, or even through some electromechanical device, having a lower frequency response than the chopping frequency used. Assuming it is preferred to maintain relatively high chopping frequencies, well above the response of the feedback network in such applications, the op amp of the present invention can be provided in use with an additional high frequency feedback path simply to accommodate the offset trim generation without degrading the performance of the op amp with its primary feedback network.

Figure 1:
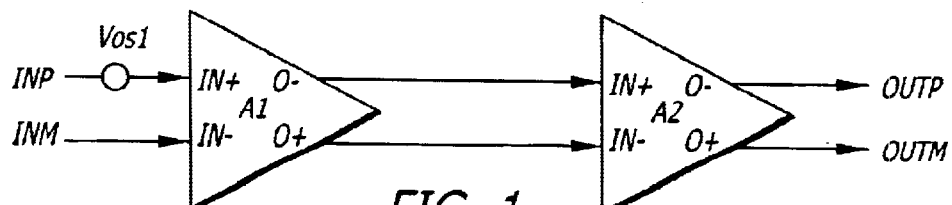
FIG. 1 is a block diagram of a prior art amplifier consisting of a differential output stage A2 driven by a differential input stage A1.
Figure 2A:
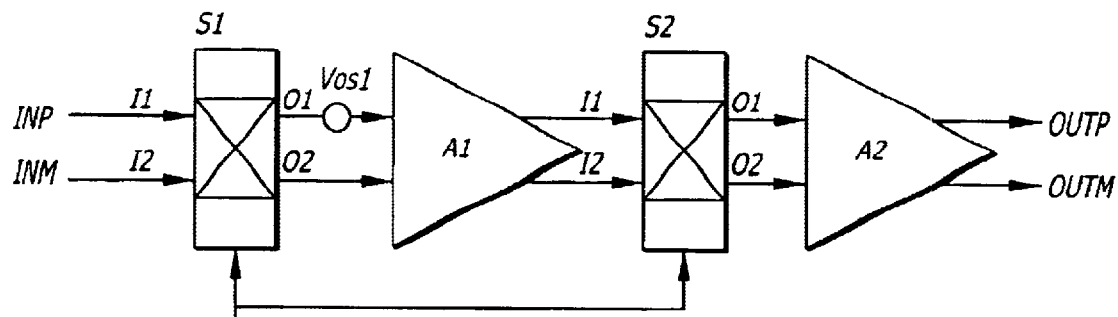
FIG. 2a is a block diagram of a chopper amplifier illustrating a well known method of reducing the offset.
Figure 2B:
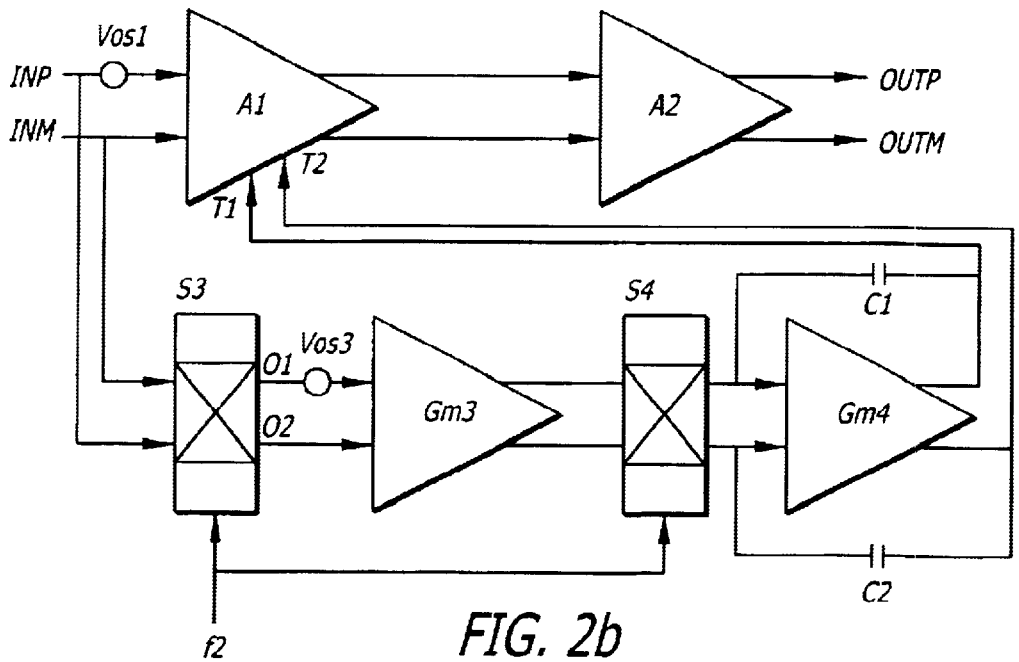
FIG. 2b is a block diagram of a chopper stabilized amplifier illustrating another well known method of reducing the offset.
Figure 3:
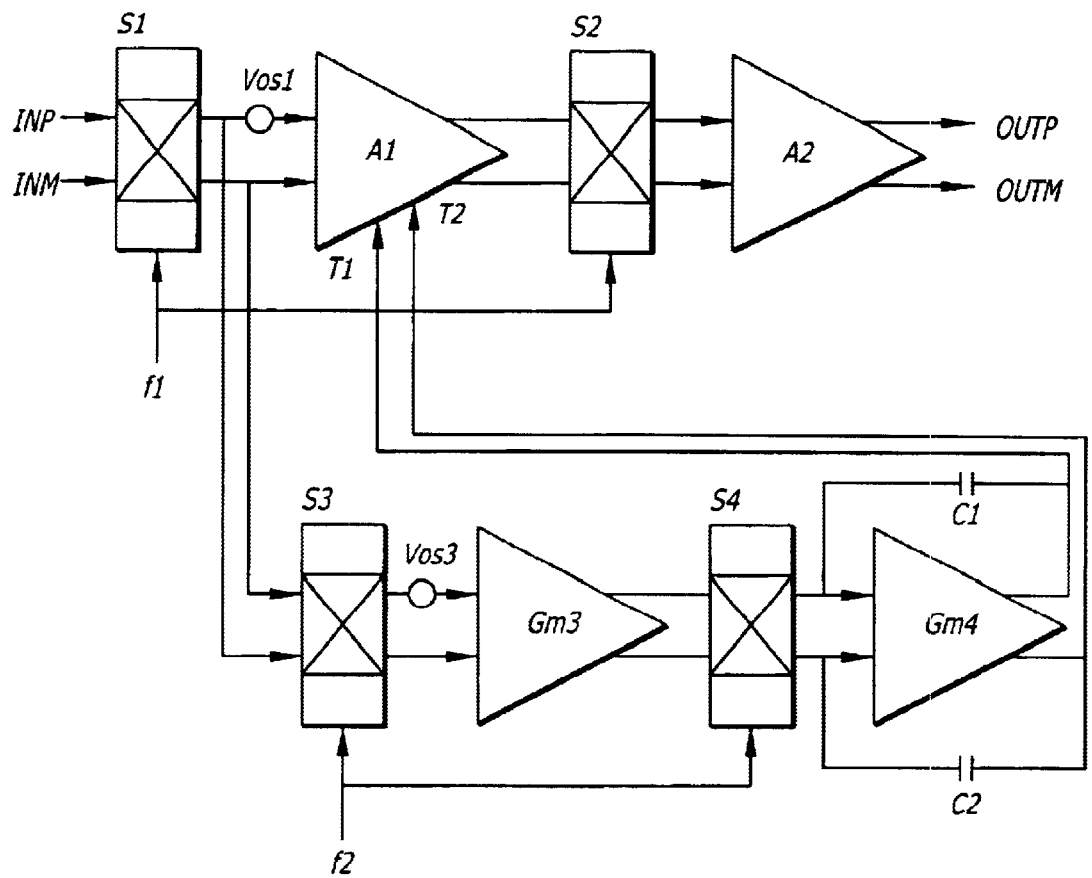
FIG. 3 is a diagram illustrating a first op amp in accordance with the present invention.

Now referring to FIG. 3, a diagram illustrating a first op amp in accordance with the present invention may be seen. In addition to the differential input stage A1, differential output stage A2 and the choppers S1 and S2, there are now two additional choppers S3 and S4, as well as two additional amplifier stages Gm3 and Gm4. The transconductance amplifier Gm4 is itself provided with capacitive feedback (capacitors C1 and C2), and thus acts as an integrator. An amplifier so connected will be referred to herein as an integrator. As before, the input offset of the input stage is modeled as a lumped offset voltage Vos1, with the modeled input stage A1 itself having a zero offset, and thus zero average input in a feedback system. In the diagram of FIG. 3, choppers S3 and S4 and amplifier Gm3 and integrator Gm4 act as an additional chopper amplifier. In particular, the offset voltage Vos1 is measured by amplifier Gm3, and after it passes through the integrator Gm4, is fed back to the trim ports T1 and T2 of input stage A1. The trim ports T1 and T2 are connected to the input stage A1 to skew its input offset either way responsive to the differential input to the trim ports. In that regard, while the trim ports are shown connected to the input stage A1, functionally the input to the trim ports varies the input offset modeled as the offset voltage Vos1 with a range adequate to drive ordinary offset voltages through zero. Offset adjustment techniques and circuits using trim ports for offset control are well known and need not be set forth in detail herein. (See for instance the MAX400 operational amplifier, manufactured by the assignee of the present invention, and its provision for offset adjustment.) By integrating the offset Vos1 by integrator Gm4, and feeding back that integral with appropriate polarity on the trim ports T1 and T2, the offset Vos1 of stage A1 can be reduced to close to zero. The offset Vos3 of amplifier stage Gm3 is canceled by the chopping action of choppers S3 and S4 in the same way as described before with regard to FIG. 2.

To further understand the functioning of the invention, consider again that the voltage feedback around the composite amplifier forces the differential voltage directly at the inputs of the input stage A1 to be zero. Therefore, the voltage on the inputs of chopper S3 is equal to the offset Vos1. If the combination of chopper S3, amplifier Gm3 and chopper S4 is considered as an ideal amplifier stage with zero offset, then it can be seen that this ideal combination reduces the offset Vos1 to almost zero by driving the trim terminals T1 and T2 of input stage A1, with proper polarity, by the integral of the offset of input stage A1.

An amplifier system that achieves high precision through the use of amplifier Gm3, integrator Gm4 and choppers S3 and S4 (but without choppers S1 and S2) is a special modification of what is commonly referred to as a chopper-stabilized amplifier. The amplifier system shown in FIG. 3, using both amplifier Gm3, integrator Gm4 and choppers S3 and S4, as well as choppers S1 and S2, is referred to herein as a chopper chopper-stabilized amplifier.

As was the case with the amplifier shown in FIG. 2, the chopping action by choppers S1 and S2 in the amplifier of FIG. 3 modulates the offset by the chopping frequency f1. However, because the offset is now greatly reduced by the addition of amplifier Gm3, integrator Gm4 and choppers S3 and S4, the energy content of the output signal at the chopping frequency is much lower, and in general, filtering at the chopping frequency is not required.

The filtering of the square wave, resulting from the offset voltage Vos3, is achieved by integrator Gm4. However, the high-frequency characteristics of the overall amplifier are not affected by this filtering because high-frequency input signal components pass through amplifier stages A1 and A2, but not through integrator Gm4. The clock frequency f2 driving the choppers S3 and S4 could be identical to f1, but does not have to be. Since the loop including chopper S3, amplifier Gm3, chopper S4 and integrator Gm4 is tracking DC and very low frequency variations in the offset voltage Vos1, the filtering of the square wave resulting from the offset voltage Vos3 provided by the integrator may intentionally be very substantial.

Figure 3A:
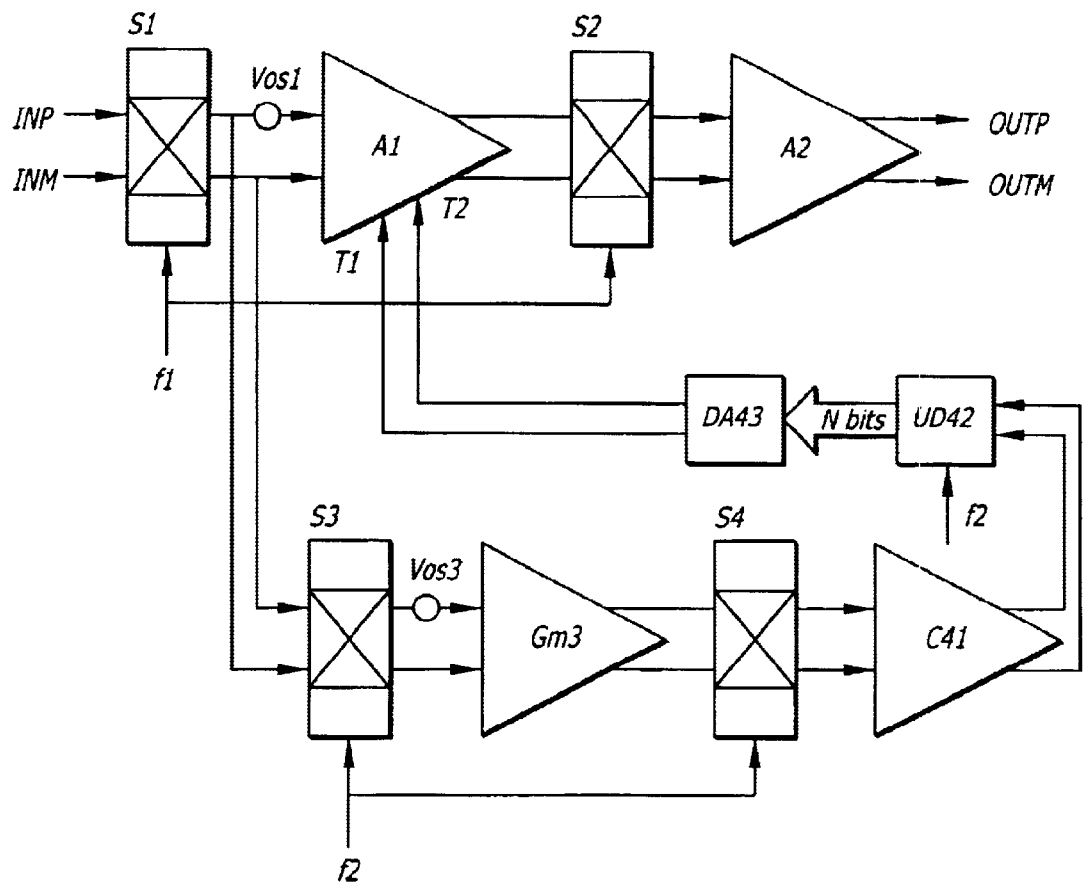
FIGS. 3a and 3b are diagrams illustrating alternate embodiments of the first op amp in accordance with the present invention using in place of an integrator, a combination of a comparator, a clocked up-down counter and a digital-to-analog converter, and a sigma-delta modulator, followed by an up/down counter and a digital-to-analog converter, respectively.
Figure 3B:
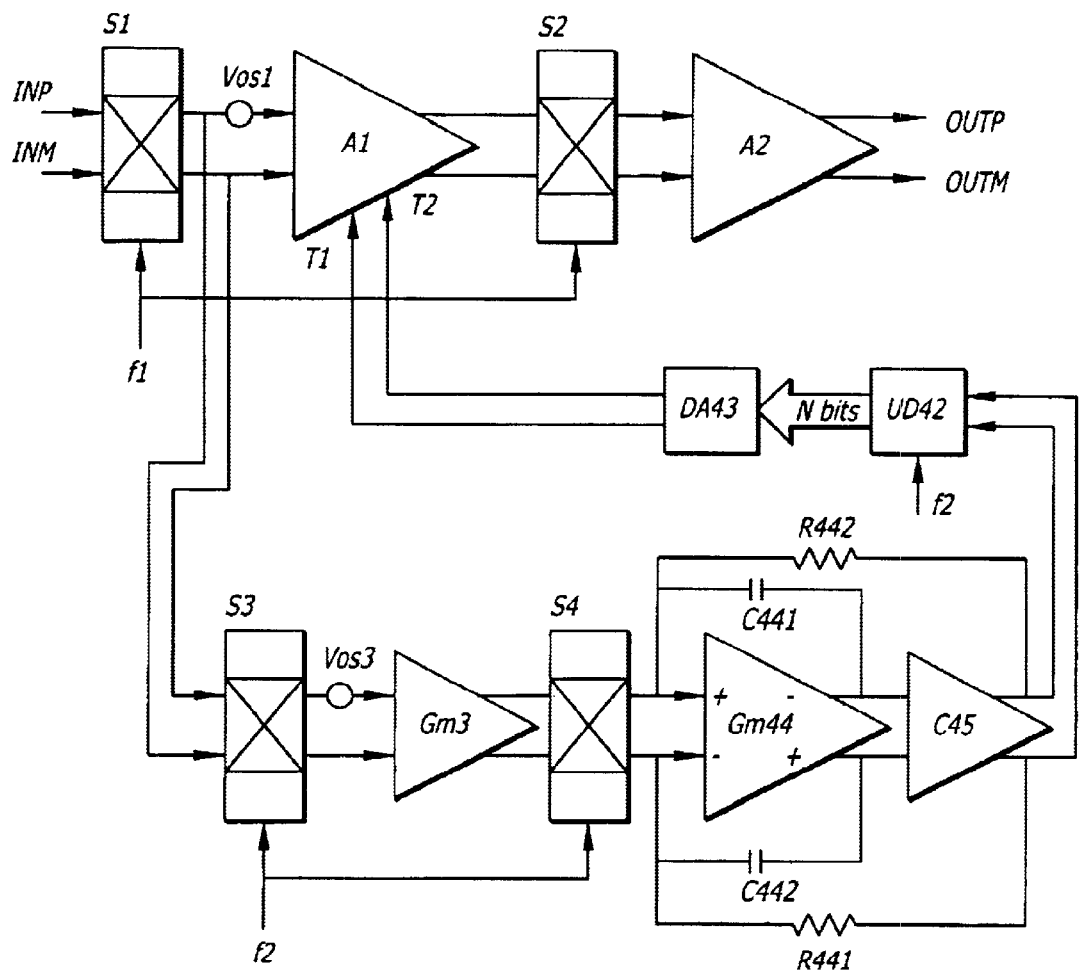

As an alternative implementation as shown in FIG. 3a, the integrator Gm4 can be replaced by a combination of a comparator C41, a clocked up-down counter UD42 and a digital-to-analog converter DA43. These three circuit blocks produce a similar integration or accumulation function and the same low-pass filtering function. A second alternative implementation shown in FIG. 3b is to replace integrator Gm4 by a sigma-delta modulator such as may be comprised of transconductance amplifier GM44, comparator C45 and feedback capacitors C441 and C442, and resistors R441 and R442, followed by an up/down counter UD42 and a digital-to-analog converter DA43. Sigma-delta modulators or converters (also known as delta-sigma converters) in various forms are well known, and the various forms thereof need not be described in detail herein. Information on delta-sigma converters may be found in "Delta-Sigma Data Converters," edited by Steven R. Norsworthy et al., IEEE Press, 1997.

These alternative implementations allow for a very low filter frequency without the use of excessively large capacitors. All of the foregoing implementations may be considered to accumulate the effects of the offset voltage and to adjust the amplifier in accordance with that accumulation to drive the offset voltage to zero, thereby preventing the further accumulation of the effects of the offset voltage. In that regard, the words integrate, integrator and similar words are used herein and in the claims in the more general sense of accumulating something responsive to the input offset, rather than in a strict mathematical sense. By way of example, the integrator formed by GM4 and its feedback provides the time integral of the amount of the offset, while the comparator, up/down counter and digital-to-analog converter of FIG. 3a does not provide the time integral of the amount of the offset, but can be considered to accumulate an effect of the offset, actually the integral of the time the offset is of one sign minus the time the offset is of the other sign.

Figure 4:
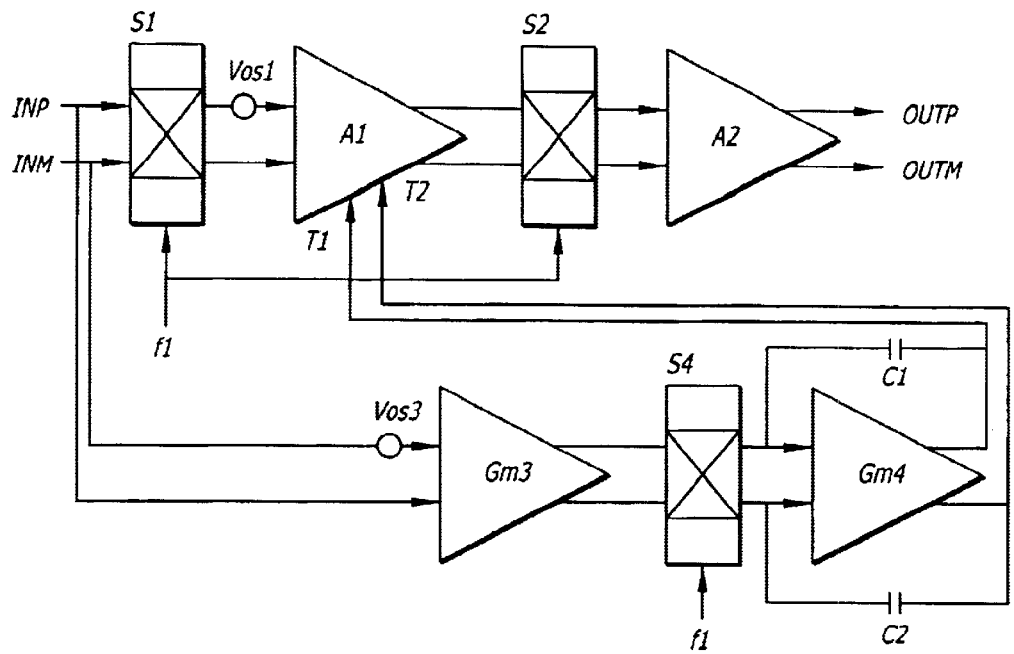
FIG. 4 is a diagram illustrating a simplification and improvement of the embodiment of FIG. 3.

FIG. 4 is a diagram illustrating a simplification and improvement of the embodiment of FIG. 3, in that choppers S1 and S3 are combined into one chopper. The advantage of this embodiment becomes apparent when it is considered that the use of choppers invariably generates error signals due to charge injection or clock interference. Reducing the number of choppers is therefore beneficial. As before, the offset Vos1 is converted into a square wave voltage at the input terminals INP and INM with a peak-to-peak value of 2*Vos1. This square wave voltage is measured by amplifier Gm3, demodulated by chopper S4 and filtered by integrator Gm4. By driving the trim terminals T1 and T2, the offset voltage Vos1, and therefore the amplitude of the square wave voltage at the inputs INP and INM is reduced. Note that the clock frequency f1 now controls both choppers S1 and S2 as well as chopper S4.

Figure 4A:
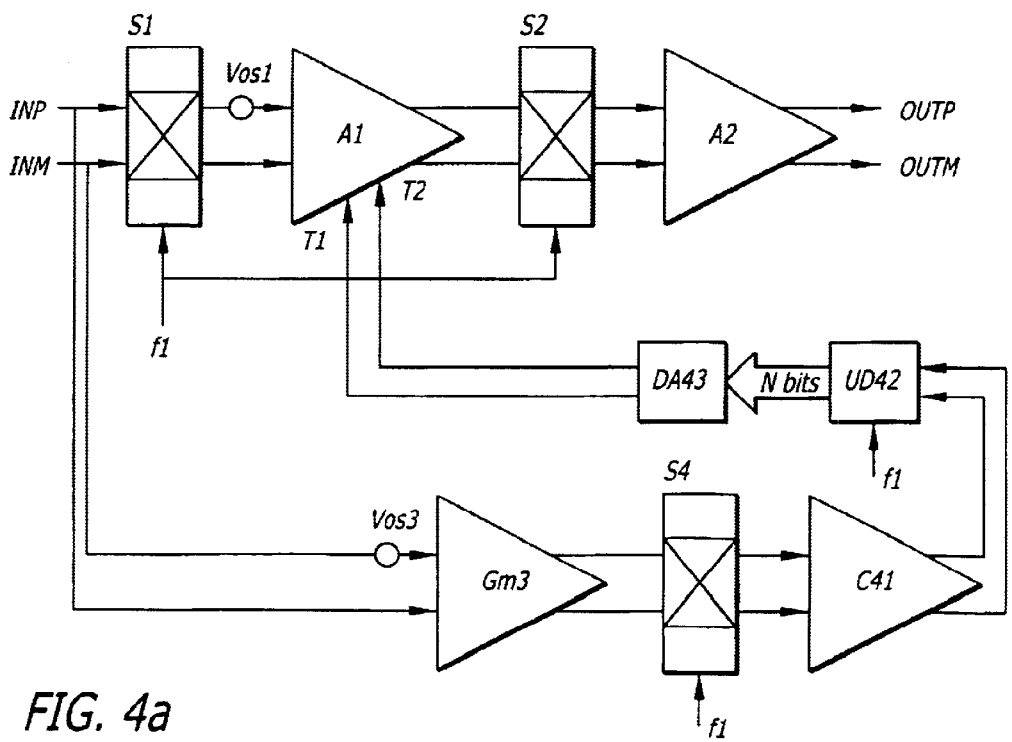
FIGS. 4a and 4b are diagrams illustrating alternate embodiments of the op amp of FIG. 4 using in place of an integrator, a combination of a comparator, a clocked up-down counter and a digital-to-analog converter, and a sigma-delta modulator, followed by an up/down counter and a digital-to-analog converter, respectively.
Figure 4B:
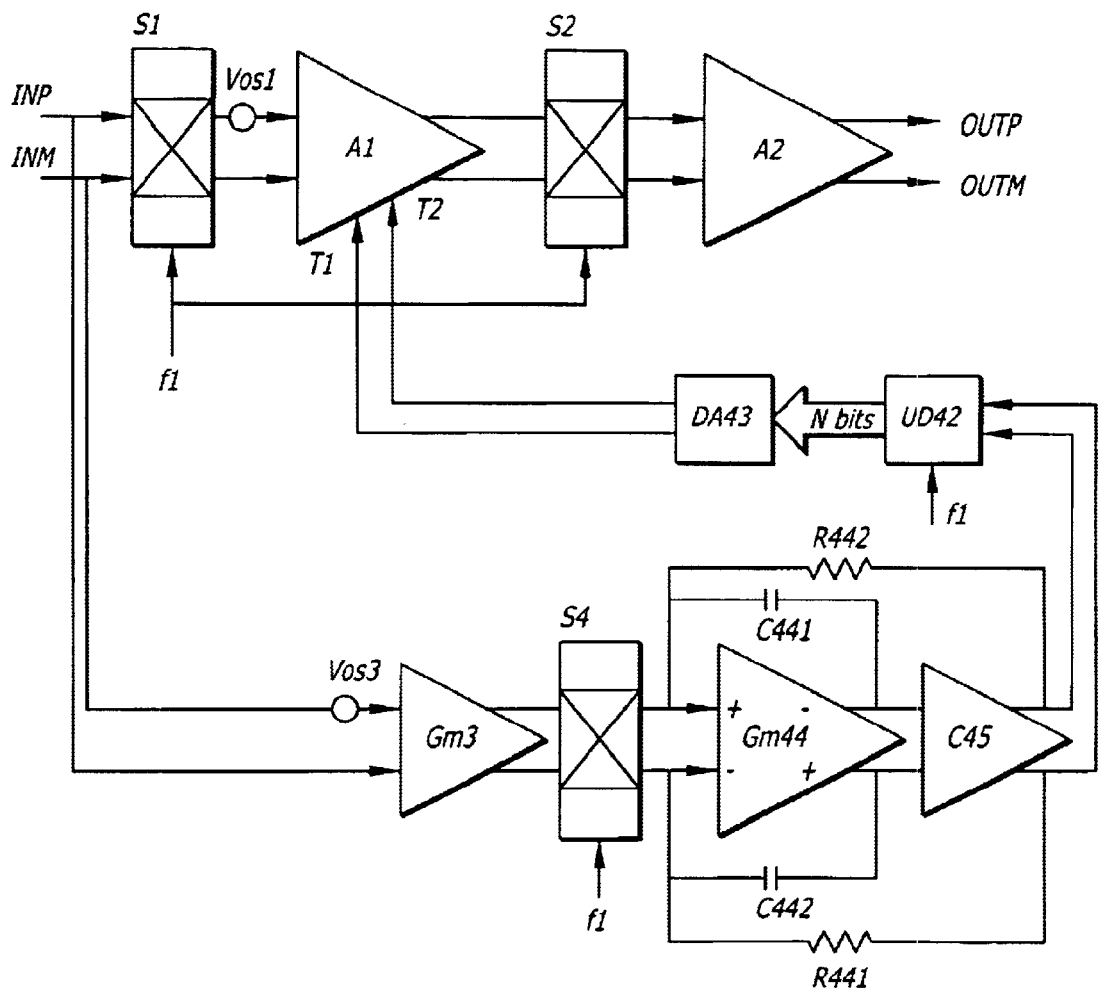

As before, the low-pass filter around integrator Gm4 can be implemented by an analog filter, as shown in FIG. 3, or by the variations described above. As an alternative implementation as shown in FIG. 4a, the integrator Gm4 of FIG. 4 can be replaced by a combination of a comparator C41, a clocked up-down counter UD42 and a digital-to-analog converter DA43. A second alternative implementation shown in FIG. 4b is to replace integrator Gm4 by a sigma-delta modulator comprised of transconductance amplifier GM44, comparator C45 and feedback capacitors C441 and C442, and resistors R441 and R442, followed by an up/down counter UD42 and a digital-to-analog converter DA43.

The offset Vos3 of amplifier Gm3 ideally does not have a negative influence on the compensation of the offset Vos1 of input stage A1 because the chopping action of choppers S1 and S4 as explained before. Because choppers S1 and S4 are continuously switching, the effective offset of amplifier Gm3 is seen as successively positive and negative, resulting in an average value that approaches zero. This is only true as long as the duty cycle of the clock signal is exactly 50%. Any deviation from the 50% number results in a non-zero offset residue of amplifier Gm3, and consequently, in a non-zero offset residue of input stage A1 as well, because offset voltage Vos1 is not compensated completely.

Figure 5:
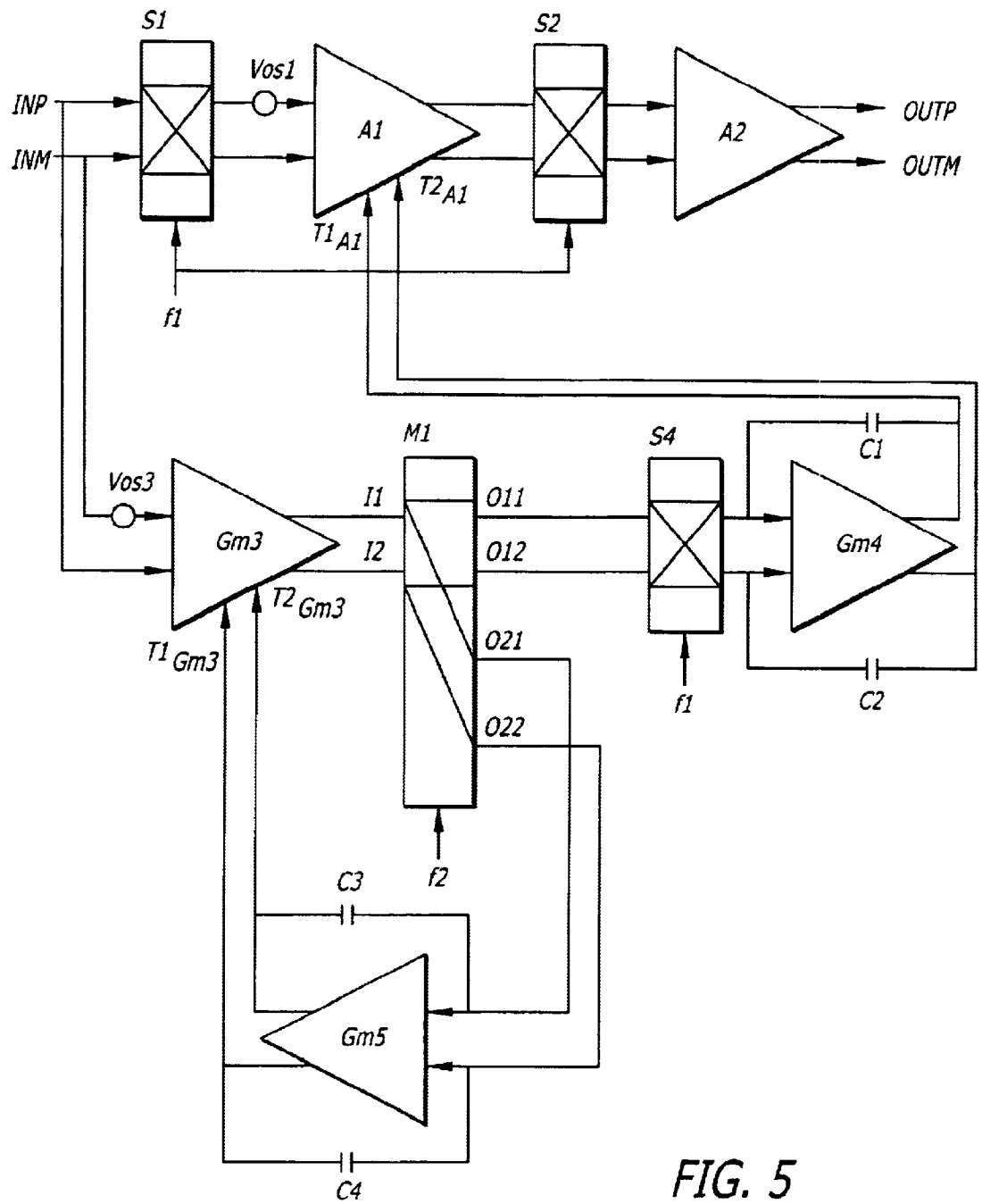
FIG. 5 is a diagram illustrating a further improvement on the embodiment of FIG. 4.

FIG. 5 is a diagram illustrating a further improvement on the embodiment of FIG. 4 that circumvents the requirement for a 50% duty cycle. A multiplexer M1 is inserted between amplifier Gm3 and chopper S4. This multiplexer consists of switches with two positions. In the first position, the inputs I1 and I2 are connected to the outputs O11 and O12, respectively. In the second position, the inputs I1 and I2 are connected to the outputs O21 and O22, respectively. The multiplexer M1 repeatedly switches between the first and the second position at the rate of a clock signal f2. Preferably, the frequency of clock signal f2 is one half of the frequency of the clock signal f1. When the switches are in the first position, the circuit operates as before, with the outputs of amplifier Gm3 driving the integrator Gm4 through the chopper S4. In the second position, the outputs of amplifier Gm3 are driving the integrator Gm5, which in turn is driving the trim terminals T1 and T2 of amplifier Gm3.

This is what is commonly referred to as an auto-zero loop. To understand its operation, assume for the moment that the offset Vos1 of stage A1 is zero. The overall feedback around the composite amplifier then forces the voltage difference between the inputs INP and INM to be (almost) zero. The effective input voltage to amplifier Gm3 is then equal to Vos3. The feedback through multiplexer M1, integrator Gm5, and back to amplifier Gm3, produces a correction signal that is equal but opposite in sign to the signal resulting from the offset voltage Vos3. This forces the output of amplifier Gm3 to be zero, effectively auto-zeroing amplifier Gm3. When the switches in multiplexer M1 are moved back into the first position, the inputs of integrator Gm5 are floating (zero input current to the integrator) and the correction voltage needed to compensate offset voltage Vos3 remains stored on the integrator capacitors C3 and C4. Likewise, when the switches in M1 are in the second position, the inputs of integrator Gm4 are floating (zero input current to the integrator) and the voltage needed to compensate offset voltage Vos1 is stored in the capacitors C1 and C2. In reality, it may take several cycles before all of the offset voltages are completed compensated. Note that there is now no 50% requirement on the duty cycle of either f1 or f2.

Figure 5A:
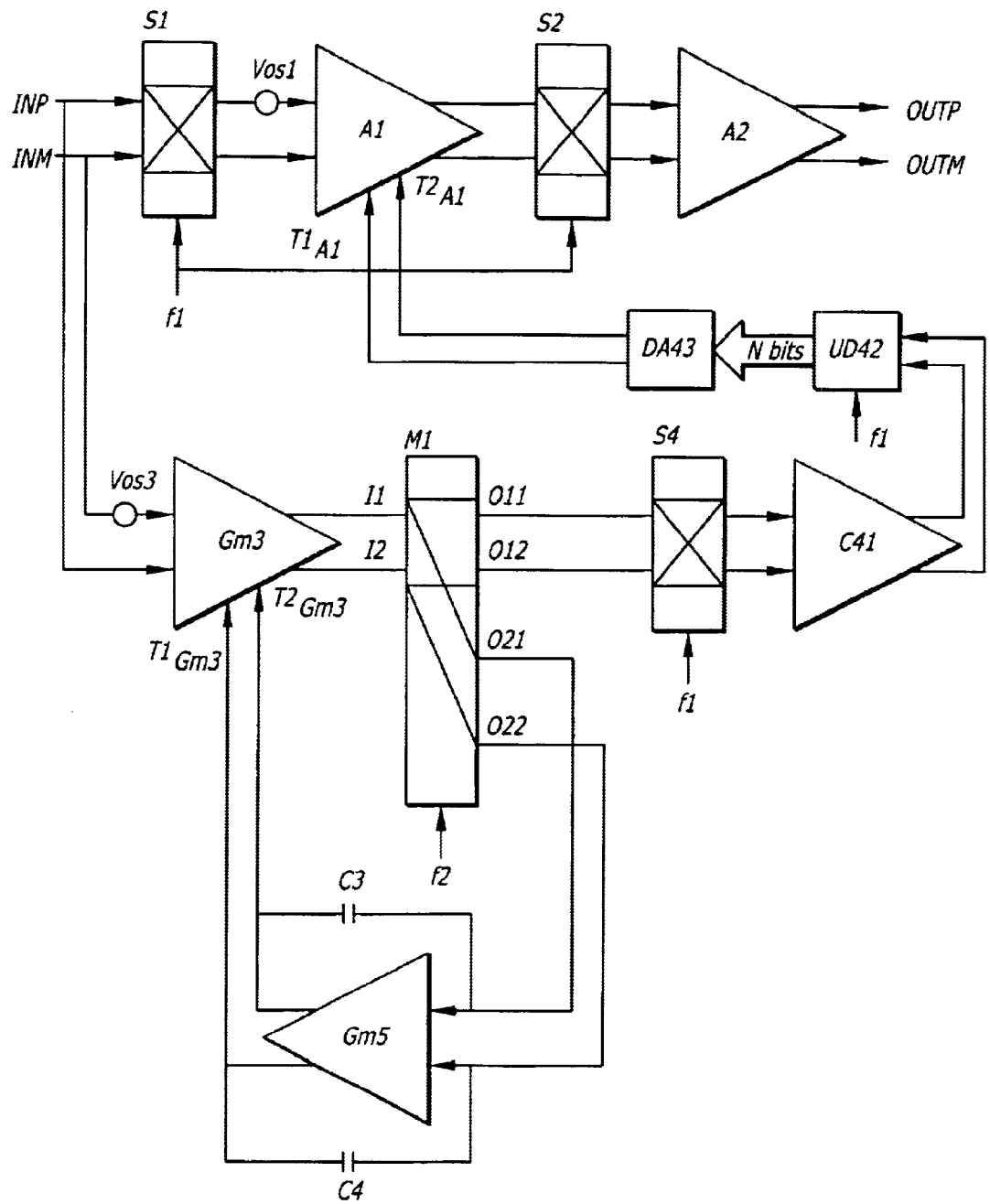
FIGS. 5a and 5b are diagrams illustrating alternate embodiments of the op amp of FIG. 5 using in place of an integrator, a combination of a comparator, a clocked up-down counter and a digital-to-analog converter, and a sigma-delta modulator, followed by an up/down counter and a digital-to-analog converter, respectively.
Figure 5B:
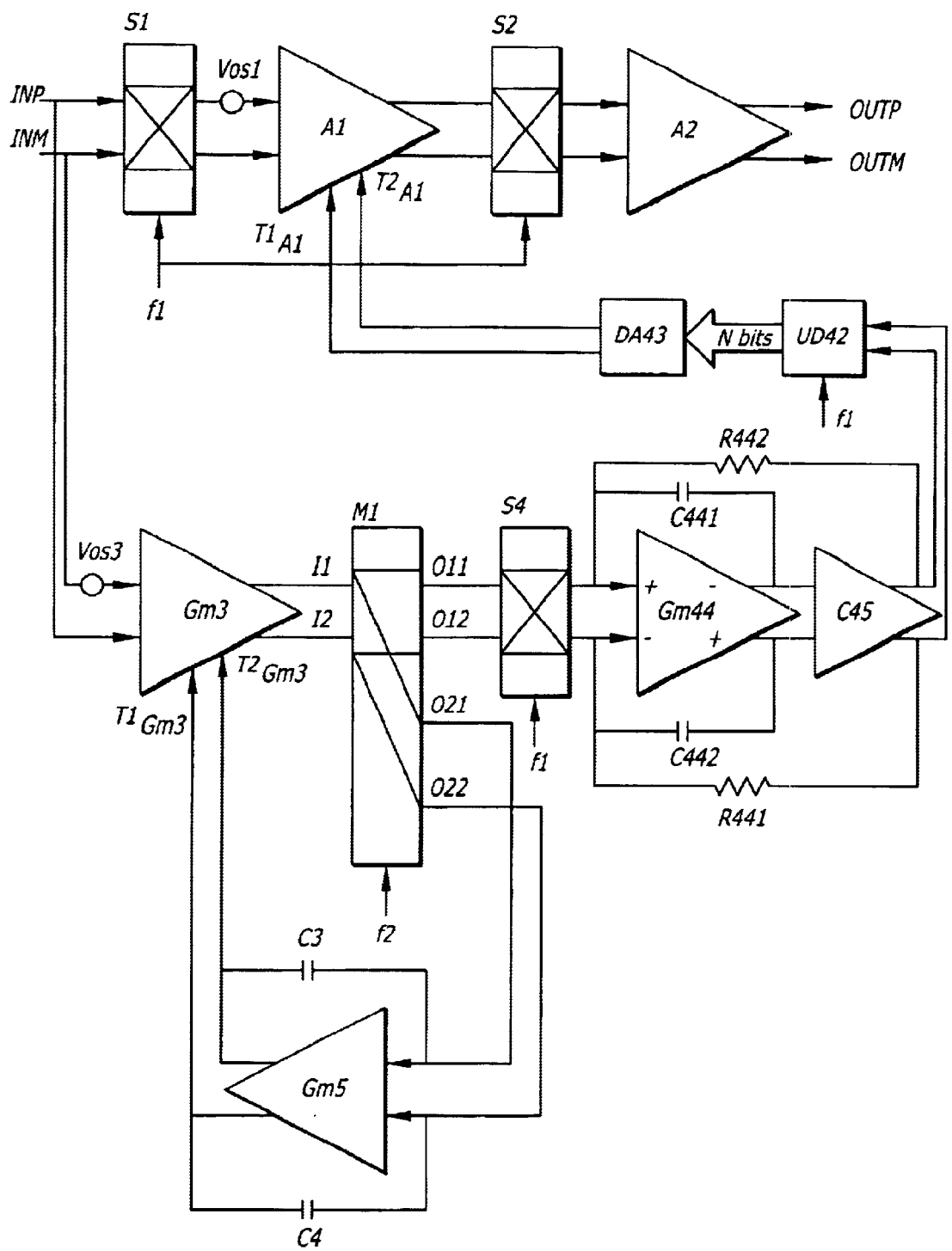

As before, as an alternative implementation shown in FIG. 5a, the integrator Gm4 can be replaced by a combination of a comparator C41, a clocked up/down counter UD42 and a digital-to-analog converter DA43. A second alternative implementation shown in FIG. 5b is to replace integrator Gm4 by a sigma-delta modulator comprised of transconductance amplifier GM44, comparator C45 and feedback capacitors C441 and C442, and resistors R441 and R442, followed by an up/down counter UD42 and a digital-to-analog converter DA43.

Figure 6:
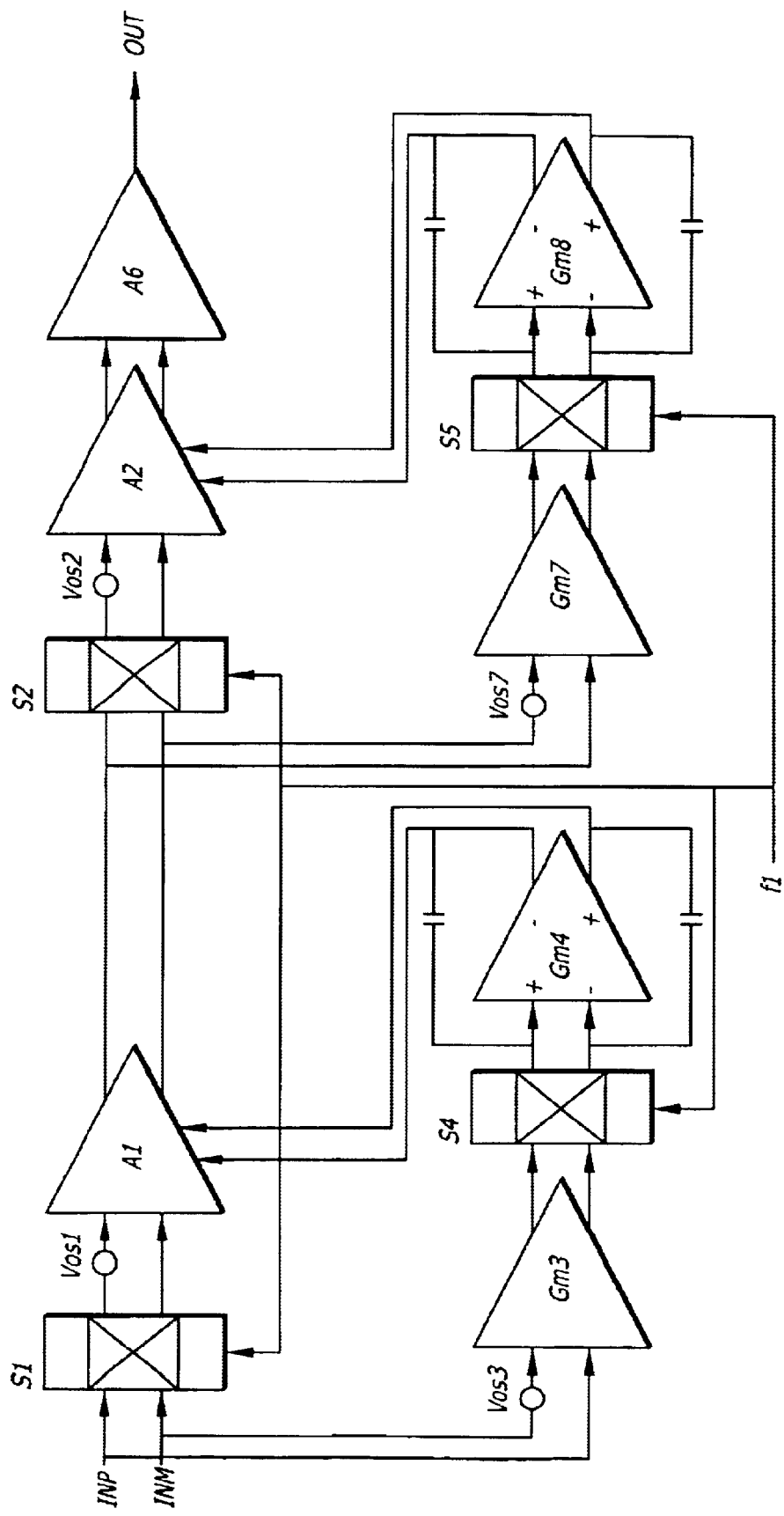
FIG. 6 is a diagram showing a still further improvement of the embodiment of FIG. 4.

FIG. 6 is a diagram showing a still further improvement of the embodiment of FIG. 4. To increase the overall voltage gain of the composite amplifier, often an output amplifier stage A6 is needed. This is shown in FIG. 6 where an additional stage A6 is added after stage A2. (Such an additional amplifier stage may also be added to any of the other embodiments, if desired, such as is also shown in FIG. 3.) As is common in operational amplifiers, additional stage A6 in FIG. 6 also converts the signal from differential to single ended, resulting in just one output signal OUT. Although this hasn't been generally discussed in relation to the previous Figures, the amplifier stages following chopper S2 also may have offsets that degrade the precision of the operational amplifier. In FIG. 6, the combined offsets of stages A2 and A6 are modeled by offset voltage Vos2 in series with the inputs of stage A2. Note that the effect of offset Vos2 on the precision of the composite amplifier is reduced by the gain of the input stage A1, but that the chopping action by choppers S1 and S2 does not help to decrease the effect of offset Vos2. In FIG. 6, the offset Vos2 of stage A2 is compensated by the added stages Gm7 and Gm8 in combination with chopper S2 and the additional chopper S5. These circuit blocks compensate Vos2 in a manner identical to which the offset Vos1 of stage A1 is compensated by amplifiers Gm3 and Gm4 and choppers S1 and S4.

Figure 7A:
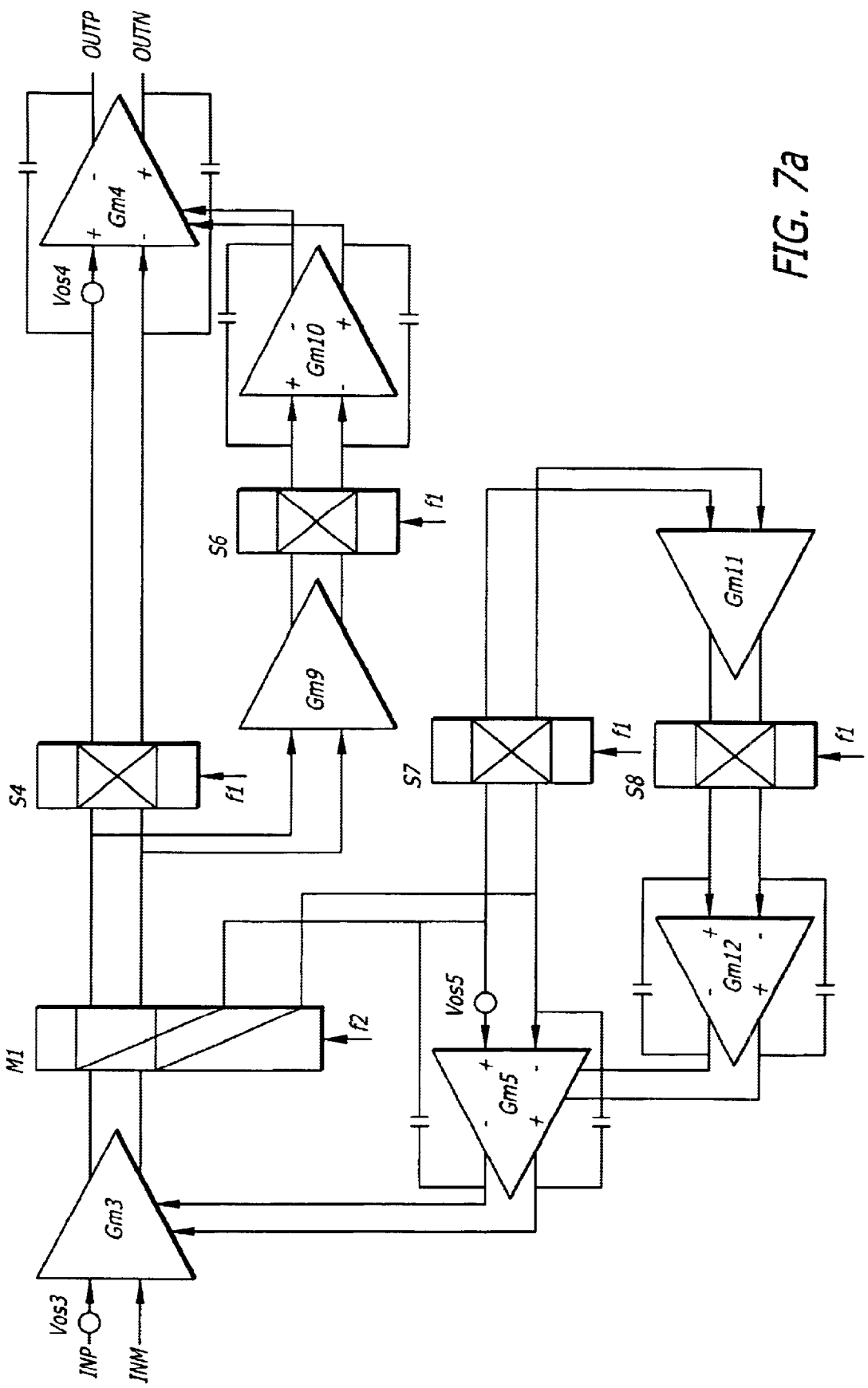

The improvements shown in FIGS. 5 and 6 can be combined, and moreover, further extensions of the circuits illustrated in the previous Figures can be realized. An example is shown in FIG. 7, with details of blocks COMP_VOS1 and COMP_VOS2 being shown in FIGS. 7a and 7b. As before, the offset Vos1 of stage A1 is compensated by amplifier Gm3, integrator Gm4 and choppers S1 and S4; the offset Vos3 of Gm3 is compensated by the auto-zero loop consisting of amplifier Gm3, multiplexer M1 and integrator Gm5; the offset Vos2 of stage A2 is compensated by amplifier Gm7, integrator Gm8 and choppers S2 and S5. New in these Figures are the compensation of Vos4 of integrator Gm4 by amplifier Gm9, integrator Gm10 and choppers S4 and S6, the compensation of Vos5 by amplifier Gm11, integrator Gm12 and choppers S7 and S8, and the compensation of Vos7 by the auto-zero loop of amplifier Gm7, multiplexer M2 and integrator Gm13. In this manner, the offset of each of the building blocks can be compensated. The technique of adding circuit blocks to compensate for the offset of previously inserted circuit blocks can be repeated as often as necessary to achieve the required level of precision. Note that the newly added circuit blocks invariably are plagued by their own offset voltage, but that the influence of this offset on the overall performance of the composite amplifier is reduced with each additional level of circuitry that is added.

Figure 8:
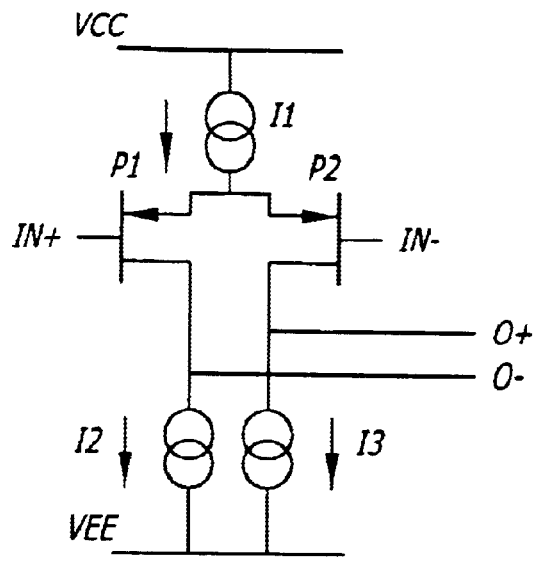
FIG. 8 shows one possible implementation of the amplifier blocks A1 and A2 using PMOS transistors.

The implementation of the amplifier blocks A1 and A2 as well as amplifiers Gm3–Gm13 can be realized in many ways. FIG. 8 shows one possible implementation using PMOS transistors. The PMOS transistors P1 and P2 form a so-called differential pair that transfers the differential input voltage between the input terminals IN+ and IN− into a differential output current flowing from OUT+ to OUT−. Current sources I1, I2 and I3 direct a current flow as indicated by the arrow. The simplified implementation does not show circuitry intended to control the common-mode voltage on the output of the amplifier stage, nor does it show circuitry to extend the output common-mode voltage range, though persons skilled in the art of analog integrated circuit design will have no trouble adding the elements to perform these functions. Moreover, although FIG. 8 shows the use of PMOS transistors, a similar implementation can be achieved by using NMOS transistors or bipolar transistors of either the PNP or NPN type.

Figure 9:
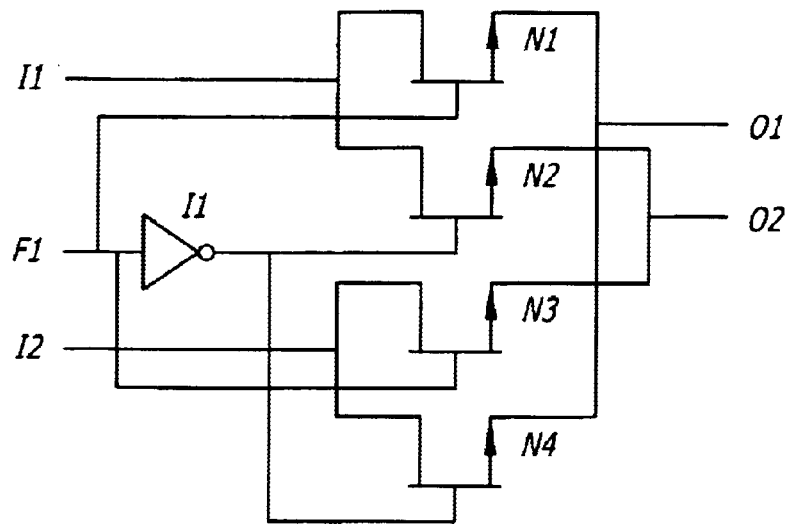
FIG. 9 shows one possible implementation of the chopper circuits using NMOS transistors.

FIG. 9 shows one possible implementation of the chopper circuits using NMOS transistors. When the clock signal on terminal F1 is high, the transistors N1 and N3 are activated in a manner that creates a very low impedance between input I1 and output O1, and input I2 and output O2, respectively. At the same time, the transistors N2 and N4 are deactivated by the low signal coming from the inverter I1, which inverts the clock signal F1. Because of this, a very high impedance exists between input I1 and output O2, and input I2 and output O1, respectively. When the clock signal changes polarity, the transistors N1 and N3 are deactivated, whereas transistors N2 and N4 are activated. This creates a low impedance between input I1 and output O2, and input I2 and output O1, respectively. Note that the phase delay in the clock signal F1, when passing through the inverter I1, should be very small in order to guarantee that the signal transitions from high to low and vice versa in both the clock signal and the inverted clock signal occur at the same moment.

Here, too, many implementation alternatives exist, including but not limited to the use of PMOS transistors, the use of a combination of PMOS and NMOS transistors, and the use of bipolar transistors of either the NPN or the PNP type. The multiplexers M1 and M2, shown in FIGS. 5 and 7, can be realized in a manner very similar to the chopper realization shown in FIG. 9. Here, too, many alternative implementations in various technologies exist, and will be apparent to those skilled in the art.

In the various embodiments disclosed to illustrate preferred embodiments of the present invention, the use of transconductance amplifiers has been suggested by identifying certain amplifiers as Gm1, Gm2, etc. However the invention is not so limited, as other types of amplifiers may be used as desired. Similarly, references to amplifier stages such as input stage A1 and output stage A2 are not to be considered as limiting, as each stage may itself be multiple stages. In that regard, referring again to FIG. 6, amplifier stage A1 is trimmed to eliminate the offset Vos1 and amplifier stage A2 is trimmed to eliminate offset Vos2. Alternatively, the input stage A1 of FIG. 3 could be both stages A1 and A2 of FIG. 6, with stage A2 of FIG. 3 being the single ended stage A6 of FIG. 6. In this case, the modeled offsets Vos1 and Vos2 of FIG. 6 would be remodeled in FIG. 3 as a new single offset Vos1 of the input stage A1, with stage A2 being trimmed. Consequently a single trimming circuit may be used to trim offsets of multiple stages by driving the offset combined or lumped as a single input offset to zero or near zero. Preferably however, the trimming method used should have the same effective response to power supply variations as the offsets themselves, so that power supply noise will not couple into the op amp offset and thus the op amp output, as the integrators will be configured to not follow an offset variation of any substantial frequency.

The foregoing description is intended to be illustrative only and not by way of limitation of the invention, as numerous alternative embodiments in accordance with the invention will be apparent to those skilled in the art. Thus while certain preferred embodiments of the present invention have been disclosed herein, it will be obvious to those skilled in the art that various changes in form and detail may be made in the invention without departing from the spirit and scope of the invention as set out in the full scope of the following claims.

What is claimed is:

1. An amplifier comprising:
   a first chopper;
   a first amplifier stage coupled to an output of the first chopper;
   a second chopper coupled to an output of the first amplifier stage;
   a second amplifier stage coupled to an output of the second chopper;
   a third chopper coupled to the output of the first chopper;
   a third amplifier stage coupled to an output of the third chopper;
   a fourth chopper coupled to an output of the third amplifier stage; and,
   an integrator coupled to an output of the fourth chopper, an output of the integrator being coupled to the first amplifier stage to trim the input offset thereof.

2. The amplifier of claim 1 wherein the first through fourth chopper, the first through third amplifier stages and the integrator are devices having differential inputs and differential outputs.

3. The amplifier of claim 2 wherein the integrator is an amplifier with capacitive negative feedback.

4. The amplifier of claim 2 wherein the integrator comprises:
   a comparator having an input coupled to the output of the fourth chopper;
   an up/down counter coupled to an output of the comparator; and,
   a digital-to-analog converter having a digital input coupled to an output of the up/down counter and an analog output providing the integrator output.

5. The amplifier of claim 2 wherein the integrator comprises:
   a sigma-delta modulator having an input coupled to the output of the fourth chopper;
   an up/down counter coupled to an output of the sigma-delta modulator; and,
   a digital-to-analog converter having a digital input coupled to an output of the up/down counter and an analog output providing the integrator output.

6. An amplifier comprising:
   a first chopper;
   a first amplifier stage coupled to an output of the first chopper;
   a second chopper coupled to an output of the first amplifier stage;
   a second amplifier stage coupled to an output of the second chopper;
   a third amplifier stage coupled to the input of the first chopper;
   a third chopper coupled to an output of the third amplifier stage; and,
   a first integrator coupled to an output of the third chopper, an output of the first integrator being coupled to the first amplifier stage to trim the input offset thereof.

7. The amplifier of claim 6 wherein the first through third choppers, the first through third amplifier stages and the integrator have differential inputs and differential outputs.

8. The amplifier of claim 7 wherein the first integrator comprises an amplifier with capacitive negative feedback.

9. The amplifier of claim 7 wherein the first integrator comprises:
   a comparator having an input coupled to the output of the fourth chopper;
   an up/down counter coupled to an output of the comparator; and,
   a digital-to-analog converter having a digital input coupled to an output of the up/down counter and an analog output providing the integrator output.

10. The amplifier of claim 7 wherein the first integrator comprises:
    a sigma-delta modulator having an input coupled to the output of the fourth chopper;
    an up/down counter coupled to an output of the sigma-delta modulator; and,
    a digital-to-analog converter having a digital input coupled to an output of the up/down counter and an analog output providing the integrator output.

11. The amplifier of claim 7 further comprised of a multiplexer having an input and first and second outputs, and a second integrator having an input and an output, the output of the third amplifier stage being coupled to the input of the multiplexer, the first output of the multiplexer being coupled to the input of the third chopper, whereby the third amplifier stage is coupled to the third chopper through the multiplexer, the second output of the multiplexer being coupled to the input of the second integrator and the output of the second integrator being coupled to the third amplifier stage to trim the input offset thereof, the inputs and outputs of the multiplexer and the second integrator being differential inputs and outputs.

12. The amplifier of claim 11 wherein the second integrator is an amplifier with capacitive negative feedback.

13. The amplifier of claim 11 wherein the second integrator comprises:
    a comparator having an input coupled to the output of the fourth chopper;
    an up/down counter coupled to an output of the comparator; and,
    a digital-to-analog converter having a digital input coupled to an output of the up/down counter and an analog output providing the integrator output.

14. The amplifier of claim 11 wherein the first integrator comprises:
    a sigma-delta modulator having an input coupled to the output of the fourth chopper;
    an up/down counter coupled to an output of the sigma-delta modulator; and,
    a digital-to-analog converter having a digital input coupled to an output of the up/down counter and an analog output providing the integrator output.

15. The amplifier of claim 6 further comprised of a fourth amplifier stage having an input coupled to the output of the second amplifier stage, the fourth amplifier stage having a differential input and a single ended output.

16. The amplifier of claim 7 further comprising:

a fourth amplifier stage coupled to the input of the second chopper;

a fourth chopper coupled to an output of the fourth amplifier stage;

a second integrator coupled to an output of the fourth chopper, an output of the second integrator being coupled to the second amplifier stage to trim the input offset;

the fourth amplifier stage, the fourth chopper and the second integrator having differential inputs and differential outputs.

17. The amplifier of claim 16 further comprising a fifth amplifier stage coupled to the an output of the second amplifier stage, the fifth amplifier stage having a differential input and a single ended output.

18. An amplifier comprising:

a first chopper;

a first amplifier stage coupled to an output of the first chopper;

a second chopper coupled to an output of the first amplifier stage;

a third chopper coupled to the output of the first chopper;

a second amplifier stage coupled to an output of the third chopper;

a fourth chopper coupled to an output of the second amplifier stage; and, an integrator coupled to an output of the fourth chopper, an output of the integrator being coupled to the first amplifier stage to trim the input offset thereof;

the first through fourth choppers, the first and second amplifier stages and the integrator having differential inputs and differential outputs.

19. The amplifier of claim 18 wherein the integrator is an amplifier with capacitive negative feedback.

20. The amplifier of claim 18 wherein the integrator comprises:

a comparator having an input coupled to the output of the fourth chopper;

an up/down counter coupled to an output of the comparator; and, a digital-to-analog converter having a digital input coupled to an output of the up/down counter and an analog output providing the integrator output.

21. The amplifier of claim 18 wherein the integrator comprises:

a sigma-delta modulator having an input coupled to the output of the fourth chopper;

an up/down counter coupled to an output of the sigma-delta modulator; and, a digital-to-analog converter having a digital input coupled to an output of the up/down counter and an analog output providing the integrator output.

22. An amplifier comprising:

a first chopper;

a first amplifier stage coupled to an output of the first chopper;

a second chopper coupled to an output of the first amplifier stage;

a second amplifier stage coupled to the input of the first chopper;

a third chopper coupled to an output of the second amplifier stage; and, a first integrator coupled to an output of the third chopper, an output of the first integrator being coupled to the first amplifier stage to trim the input offset thereof;

the first through third choppers, the first and second amplifier stages and the integrator having differential inputs and differential outputs.

23. The amplifier of claim 22 wherein the first integrator comprises an amplifier with capacitive negative feedback.

24. The amplifier of claim 22 wherein the first integrator comprises:

a comparator having an input coupled to the output of the fourth chopper;

an up/down counter coupled to an output of the comparator; and, a digital-to-analog converter having a digital input coupled to an output of the up/down counter and an analog output providing the integrator output.

25. The amplifier of claim 22 wherein the first integrator comprises:

a sigma-delta modulator having an input coupled to the output of the fourth chopper;

an up/down counter coupled to an output of the sigma-delta modulator; and, a digital-to-analog converter having a digital input coupled to an output of the up/down counter and an analog output providing the integrator output.

26. The amplifier of claim 22 further comprised of a multiplexer having an input and first and second outputs, and a second integrator having an input and an output, the output of the second amplifier stage being coupled to the input of the multiplexer, the first output of the multiplexer being coupled to the input of the third chopper, whereby the second amplifier stage is coupled to an output of the third chopper through the multiplexer, the second output of the multiplexer being coupled to the input of the second integrator and the output of the second integrator being coupled to the third amplifier stage to trim the input offset thereof, the inputs and outputs of the multiplexer and the second integrator being differential inputs and outputs.

27. The amplifier of claim 26 wherein the second integrator is an amplifier with capacitive negative feedback.

28. The amplifier of claim 26 wherein the second integrator comprises:

a comparator having an input coupled to the output of the fourth chopper;

an up/down counter coupled to an output of the comparator; and, a digital-to-analog converter having a digital input coupled to an output of the up/down counter and an analog output providing the integrator output.

29. The amplifier of claim 26 wherein the first integrator comprises:

a sigma-delta modulator having an input coupled to the output of the fourth chopper;

an up/down counter coupled to an output of the sigma-delta modulator; and, a digital-to-analog converter having a digital input coupled to an output of the up/down counter and an analog output providing the integrator output.

30. The amplifier of claim 22 further comprised of a third amplifier stage having a differential input coupled to the output of the first amplifier stage, and having a single ended output.

31. A method of stabilizing the offset of an operational amplifier (opamp) having a differential input comprising:

a) chopping the differential input to the opamp and a differential output of a stage of the opamp;

b) amplifying a signal responsive to the differential input to the opamp;

c) chopping the amplified differential signal provided in b);

d) integrating the chopped amplified differential signal provided in c); and, e) using the integrated, chopped amplified differential signal provided in d) to trim the input offset of the stage of the opamp.

32. The method of claim 31 wherein amplifying a signal responsive to the differential input of the stage of the amplifier comprises chopping and amplifying the chopped differential input to the opamp provided in a).

33. The method of claim 31 wherein amplifying a signal responsive to the differential input of the opamp comprises amplifying the differential input to the opamp.

34. The method of claim 33 further comprised of auto-zeroing the amplifier amplifying the signal responsive to the differential input to the opamp.

35. The method of claim 34 wherein the integrating of d) is done using another amplifier with capacitive feedback.

36. The method of claim 34 wherein the integrating of d) is done using a comparator coupled to an up/down counter coupled to a digital to analog converter.

37. The method of claim 34 wherein the integrating of d) is done using a sigma-delta modulator coupled to an up/down counter coupled to a digital to analog converter.

38. The method of claim 31 wherein the integrating of d) is done using another amplifier with capacitive feedback.

39. The method of claim 31 wherein the integrating of d) is done using a comparator coupled to an up/down counter coupled to a digital to analog converter.

40. The method of claim 31 wherein the integrating of d) is done using a sigma-delta modulator coupled to an up/down counter coupled to a digital to analog converter.

41. An amplifier comprising:
a first chopper coupled to an amplifier input;
a first amplifier stage coupled to an output of the first chopper;
a second chopper coupled to an output of the first amplifier stage; and,
a trim circuit coupled directly to the amplifier input and to the first amplifier stage, the trim circuit being responsive to signals on the amplifier input to trim the input offset of the first amplifier stage;
the first and second choppers and the first amplifier stage have differential inputs and differential outputs.

42. An amplifier comprising:
a first chopper coupled to an amplifier input;
a first amplifier stage coupled to an output of the first chopper;
a second chopper coupled to an output of the first amplifier stage; and,
a trim circuit coupled to the amplifier input and to the first amplifier stage, the trim circuit being responsive to signals on the amplifier input to trim the input offset of the first amplifier stage, the trim circuit further including an auto-zeroing circuit having an integration function.

* * * * *